(12) United States Patent
Itamura

(10) Patent No.: US 9,786,436 B2
(45) Date of Patent: Oct. 10, 2017

(54) TENSILE STRESS RESISTANT MULTILAYER CERAMIC CAPACITOR

(71) Applicant: Murata Manufacturing Co., Ltd., Nagaokakyo-shi, Kyoto-fu (JP)

(72) Inventor: Hiroto Itamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/236,596

(22) Filed: Aug. 15, 2016

(65) Prior Publication Data

US 2016/0351331 A1 Dec. 1, 2016

Related U.S. Application Data

(63) Continuation of application No. 14/867,273, filed on Sep. 28, 2015, now Pat. No. 9,443,656.

(30) Foreign Application Priority Data

Sep. 30, 2014 (JP) .................... 2014-201671

(51) Int. Cl.
| | |
|---|---|
| *H05K 1/16* | (2006.01) |
| *H01G 4/232* | (2006.01) |
| *H01G 4/30* | (2006.01) |
| *H05K 1/11* | (2006.01) |
| *H05K 1/18* | (2006.01) |
| *H01G 2/06* | (2006.01) |
| *H01G 4/248* | (2006.01) |

(Continued)

(52) U.S. Cl.
CPC ........... *H01G 4/2325* (2013.01); *H01G 2/065* (2013.01); *H01G 4/12* (2013.01); *H01G 4/248* (2013.01); *H01G 4/30* (2013.01); *H05K 1/0298* (2013.01); *H05K 1/115* (2013.01); *H05K 1/182* (2013.01); *H05K 1/185* (2013.01); *H01G 4/1227* (2013.01); *H05K 2201/10015* (2013.01)

(58) Field of Classification Search
CPC ........ H01G 4/2325; H01G 2/065; H01G 4/12; H01G 4/248; H01G 4/30; H05K 1/115; H05K 1/0298
USPC .................... 174/260, 250, 255–258, 261
See application file for complete search history.

(56) References Cited

U.S. PATENT DOCUMENTS

2016/0093438 A1\* 3/2016 Sasabayashi ............ H01G 4/12
174/260

OTHER PUBLICATIONS

Itamura, "Tensile Stress Resistant Multilayer Ceramic Capacitor", U.S. Appl. No. 14/867,273, filed Sep. 28, 2015.

\* cited by examiner

*Primary Examiner* — Tremesha S Willis
(74) *Attorney, Agent, or Firm* — Keating & Bennett, LLP

(57) ABSTRACT

A multilayer ceramic capacitor is configured such that "a" is a distance in a height direction between an effective portion and a first principal surface; "b" is a distance in a length direction between a first end surface and the effective portion in the length direction; "c" is a thickness of the thickest portion of a first base layer provided over the first principal surface; "d" is a distance in the length direction between the thickest portion of the first base layer provided over the first end surface and a portion of the first base layer located over the first principal surface and closest to a second end surface; and "e" is a maximum thickness of a portion of the first base layer provided over the first end surface; and f: the height of the ceramic body, and $2 \leq (c \cdot d + e \cdot f/2)/(a \cdot b) \leq 6$ is satisfied.

19 Claims, 6 Drawing Sheets

(51) Int. Cl.
*H05K 1/02* (2006.01)
*H01G 4/12* (2006.01)

TENSILE STRESS RESISTANT MULTILAYER CERAMIC CAPACITOR

BACKGROUND OF THE INVENTION

1. Field of the Invention

The present invention relates to a multilayer ceramic capacitor.

2. Description of the Related Art

In recent years, with the reduction in size and height of electronic devices such as cellular phones and portable music players, wiring boards mounted on the electronic devices have been progressively reduced in size. Accordingly, multilayer ceramic capacitors mounted on the wiring boards have been also progressively reduced in size and height.

As a method for densely arranging multilayer ceramic capacitors on the wiring boards, for example, it is conceivable that multilayer ceramic capacitors are built into multilayer printed wiring boards (for example, see Japanese Patent Application Laid-Open No. 2002-203735).

The multilayer ceramic capacitors built in multilayer printed wiring boards as described in Japanese Patent Application Laid-Open No. 2002-203735 are required to be thin. However, the mechanical strength of the multilayer ceramic capacitors tends to decrease as the multilayer ceramic capacitors are reduced in height. Additionally, in the case of forming external electrodes from a conductive paste, the conductive paste is applied to ends of ceramic bodies, and baked, and in this case, the contraction force (tensile stress) of the conductive paste itself is also applied to the ceramic bodies. Then, this stress remains as residual stress in the multilayer ceramic capacitors, thus further decreasing the mechanical strength of the multilayer ceramic capacitors. Accordingly, the multilayer ceramic capacitors are more likely to be cracked. In particular, thin multilayer ceramic capacitors are likely to have residual stress caused at ridges of ceramic bodies. For this reason, the thin multilayer ceramic capacitors are likely to be cracked from the ridges of the ceramic bodies into the ceramic bodies.

The residual stress in the case of firing is likely to increase as the ceramic bodies are reduced in height, and increase as the external electrodes are increased in volume.

SUMMARY OF THE INVENTION

Preferred embodiments of the present invention provide a multilayer ceramic capacitor which is unlikely to be cracked from ridges of a ceramic body into the ceramic body.

A multilayer ceramic capacitor according to a preferred embodiment of the present invention includes a ceramic body, a first internal electrode, a second internal electrode, a first external electrode, and a second external electrode. The ceramic body includes first and second principal surfaces, first and second side surfaces, and first and second end surfaces. The first and second principal surfaces extend in the length direction and width direction. The first and second side surfaces extend in the length direction and height direction. The first and second end surfaces extend in the width direction and the height direction. The first internal electrode extends in the length direction and width direction in the ceramic body. The first internal electrode extends to the first end surface. The second internal electrode extends in the length direction and width direction in the ceramic body, and is opposed in the height direction to the first internal electrode with a ceramic portion interposed therebetween. The second internal electrode extends to the second end surface. The first external electrode is connected to the first internal electrode. The first external electrode is provided over the first end surface, and over each of the first and second principal surfaces. The second external electrode is connected to the second internal electrode. The second external electrode is provided over the second end surface, and over each of the first and second principal surfaces. The first external electrode includes a first base layer provided over the ceramic body and including a metal and glass, and a first plated layer provided over the first base layer. The second external electrode includes a second base layer provided over the ceramic body and including a metal and glass, and a second plated layer provided over the second base layer.

In a preferred embodiment of the present invention, "a" is a distance in the height direction between the first principal surface and an end in the length direction of an effective portion that refers to a region where the first internal electrode and the second internal electrode are opposed in the height direction; "b" is a distance in the length direction between the first end surface and the effective portion in the length direction; "c" is a maximum thickness of a portion of the first base layer provided over the first principal surface; "d" is a distance in the length direction between a point of the first base layer over the first end surface which is farthest from the first end surface and an end of the first base layer over the first principal surface which is closest to the second end surface; "e" is a maximum thickness of a portion of the first base layer provided over the first end surface; and "f" is a height of the ceramic body, and a condition $2 \leq (c \cdot d + e \cdot f/2)/(a \cdot b) \leq 6$ is satisfied.

A multilayer ceramic capacitor according to a preferred embodiment of the present invention is preferably about 0.9 mm to about 1.1 mm in length dimension, about 0.4 mm to about 0.6 mm in width dimension, and about 0.085 mm to about 0.15 mm in height dimension.

In a multilayer ceramic capacitor according to a preferred embodiment of the present invention, the first and second plated layers each preferably include a Cu plated layer.

According to various preferred embodiments of the present invention, a multilayer ceramic capacitor that is unlikely to be cracked from ridges of a ceramic body into the ceramic body is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
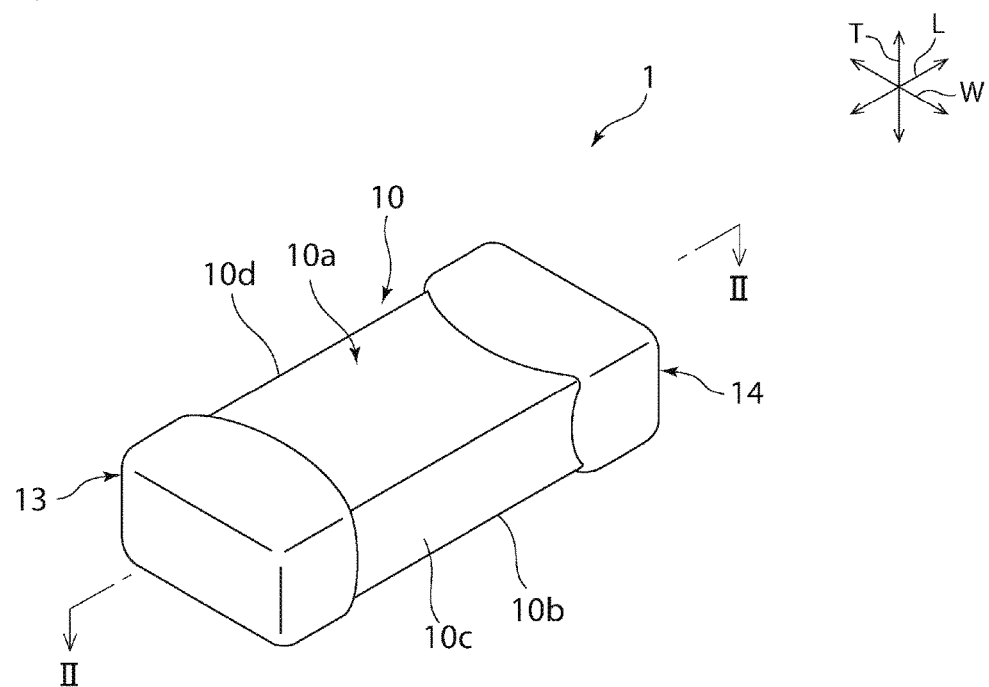
FIG. 1 is a schematic perspective view of a multilayer ceramic capacitor according to a preferred embodiment of the present invention.

Preferred embodiments of the present invention will be described below with reference to examples. However, the following preferred embodiments will be provided merely by way of example. The present invention is not limited to the following preferred embodiments in any way.

In addition, members that have the same or substantially the same functions shall be denoted by the same reference symbols in the respective drawings referenced in the preferred embodiments, etc. In addition, the drawings referenced in the preferred embodiments, etc. are schematically made. The dimensional ratios or the like between the objects drawn in the drawings may differ from the dimensional ratios or the like between real objects. The dimensional ratios or the like between the objects may also differ between the drawings. The specific dimensional ratios or the like of the objects should be determined in view of the following description.

Figure 2:
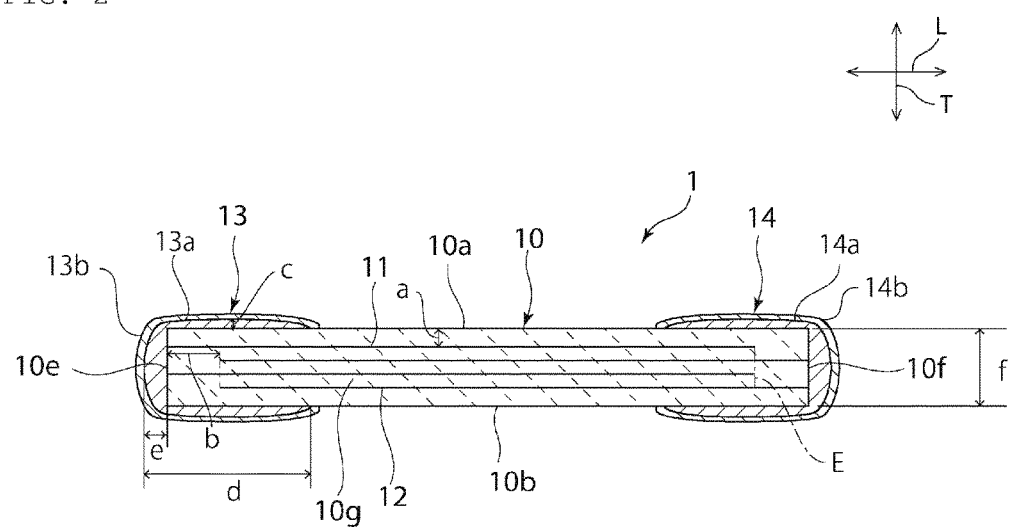
FIG. 2 is a schematic cross-sectional view of FIG. 1 along the line II-II.
Figure 3:
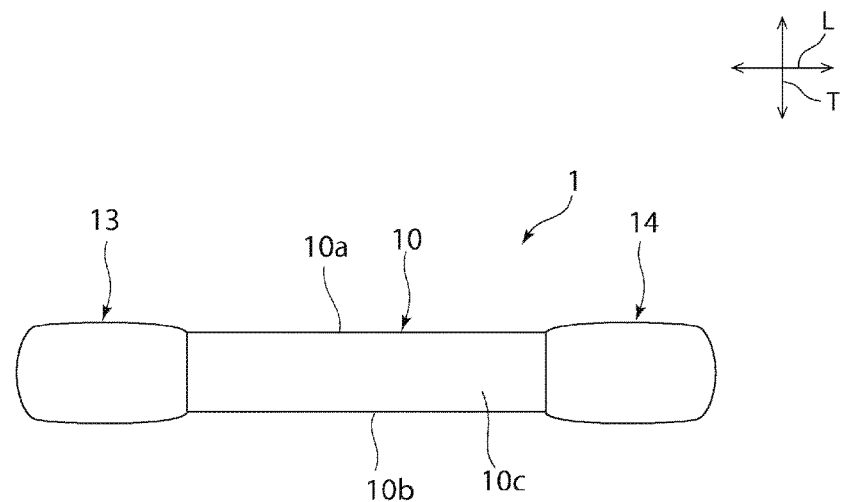
FIG. 3 is a schematic side view of a multilayer ceramic capacitor according to a preferred embodiment of the present invention.

As shown in FIGS. 1 through 3, a multilayer ceramic capacitor 1 includes a ceramic body 10. The ceramic body 10 can be formed from, for example, a dielectric ceramic material. Specific examples of the dielectric ceramic material include, for example, $BaTiO_3$, $CaTiO_3$, $SrTiO_3$, and $CaZrO_3$. With the above ceramic material as a main constituent, accessory constituents such as, for example, Mn compounds, Mg compounds, Si compounds, Fe compounds, Cr compounds, Co compounds, Ni compounds, and rare-earth compounds may be added appropriately to the ceramic body 10, depending on desired characteristics of the multilayer ceramic capacitor 1.

In the present preferred embodiment, the ceramic body 10 preferably has a cuboid shape. The "cuboid shape" herein is considered to encompass cuboids with corners or ridges rounded.

The ceramic body 10 includes first and second principal surfaces 10a, 10b, first and second side surfaces 10c, 10d, and first and second end surfaces 10e, 10f. The first and second principal surfaces 10a, 10b each extend in the length direction L and the width direction W. The first and second side surfaces 10c, 10d each extend in the length direction L and the height direction T. The first and second end surfaces 10e, 10f each extend in the width direction W and the height direction T.

The multilayer ceramic capacitor 1 is preferably about 0.9 mm to about 1.1 mm in length dimension. The multilayer ceramic capacitor 1 is preferably about 0.4 mm to about 0.6 mm in width dimension. The multilayer ceramic capacitor 1 is preferably about 0.085 mm to about 0.15 mm in height dimension. When the height dimension, length dimension, and width dimension of the ceramic body 10 are referred to respectively as DT, DL, and DW, the condition of DT<DW<DL, (1/7)DW≤DT≤(1/4)DW, or DT<about 0.15 mm is preferably met.

As shown in FIG. 2, pluralities of first and second internal electrodes 11, 12 that are substantially rectangular are disposed within the ceramic body 10. The first and second internal electrodes 11, 12 each extend in the length direction L and the width direction W. The first internal electrodes 11 are extended to the first end surface 10e, but not exposed to the second end surface 10f or the first and second side surfaces 10c, 10d. On the other hand, the second internal electrodes 12 are extended to the second end surface 10f, but not exposed to the first end surface 10e or the first and second side surfaces 10c, 10d. The first internal electrodes 11 and the second internal electrodes 12 are alternately provided at intervals mutually in the height direction T. The ceramic portions 10g provided between the first internal electrodes 11 and the second internal electrodes 12 can be adjusted to, for example, on the order of about 0.5 μm to about 10 μm in height. The first and second internal electrodes 11, 12 can be adjusted to, for example, on the order of about 0.2 μm to about 2 μm in height.

The first and second internal electrodes 11, 12 can be composed of an appropriate conductive material. The first and second internal electrodes 11, 12 can be composed of, for example, a metal such as Ni, Cu, Ag, Pd, and Au, or an alloy containing one of the metals, such as, for example, an Ag—Pd alloy.

A glass layer may be formed on exposed portions of the internal electrodes at the end surfaces 10e, 10f. The formation of the glass layer on the exposed portions of the internal electrodes 11, 12 ensures resistance to moisture and plating even when the external electrodes 13, 14 are insufficiently dense, significantly reduces or prevents ingress of moisture from the outside into the ceramic body 10, and improves resistance to moisture and plating.

The first and second external electrodes 13, 14 are provided over the ceramic body 10.

The first external electrode 13 is connected to the first internal electrodes 11. The first external electrode 13 is provided in communication with the first end surface 10e, and each of the first and second principal surfaces 10a, 10b as well as the first and second side surfaces 10c, 10d. It is to be noted that the first external electrode may be provided in communication with only the first end surface and at least one of the first and second principal surfaces in a preferred embodiment of the present invention.

The second external electrode 14 is connected to the second internal electrodes 12. The second external electrode 14 is provided in communication with the second end surface 10f, and each of the first and second principal surfaces 10a, 10b as well as the first and second side surfaces 10c, 10d. It is to be noted that the second external electrode may be provided in communication with only the second end surface and at least one of the first and second principal surfaces in a preferred embodiment of the present invention.

The first external electrode 13 includes a first base layer 13a and a first Cu plated layer 13b. The first base layer 13a is provided over the ceramic body 10. The first base layer 13a can be formed by firing a conductive paste layer formed by applying a conductive paste, for example.

The first base layer 13a includes a metal and glass. Examples of the metal included in the first base layer 13a include, for example, appropriate metals such as Ni, Cu, Ag, Pd, Au, and Ag—Pd alloys.

The first base layer 13a is preferably about 1 μm to about 20 μm in thickness.

The first plated layer 13b is provided over the first base layer 13a. The first plated layer can be composed of, for example, Cu, Ni, Ag, Pd, an Ag—Pd alloy, Au, or Sn. It is to be noted that the first plated layer 13b may be formed from a laminate body of multiple plated layers. The first plated layer 13b configured to have two-layer structure of, for example, Ni plating and Sn plating also makes it possible to mount the multilayer ceramic capacitor on the surface of a multilayer printed wiring board, rather than as a multilayer ceramic capacitor built in a multilayer printed wiring board. In the case of using the capacitor built in a multilayer printed wiring board, the first plated layer 13b is preferably Cu. As just described, when the outermost layer of the external electrode 13 includes a Cu plated film, it becomes possible to use the multilayer ceramic capacitor 1 as an electronic component built in a multilayer printed wiring board.

In addition, in the case of embedding the multilayer ceramic capacitor 1 into a multilayer printed wiring board, there is a need to provide a via hole for electronic component connection in the multilayer printed wiring board, in order to provide electrical connection to the first external electrode 13. This via hole for electronic component connection is formed with the use of a laser such as a $CO_2$ laser, for example. In the case of forming the via hole with the use of a laser, the first external electrode 13 of the multilayer ceramic capacitor 1 is directly irradiated with the laser. In this case, when the first plated layer 13b of the first external electrode 13 includes a Cu plated layer, the laser can be reflected at a high reflectance, and the capacitor is thus able to be used in a preferred manner as the multilayer ceramic capacitor 1 to be embedded into a multilayer printed wiring board. When the laser reflectance is low with respect to the first external electrode 13 of the multilayer ceramic capacitor 1, the laser may reach even the inside of the multilayer ceramic capacitor 1, and damage the multilayer ceramic capacitor 1.

In addition, the surface of the first plated layer 13b may be at least partially oxidized. For example, the first plated layer 13b preferably has ridges oxidized. In this case, when the multilayer ceramic capacitor 1 is embedded into a wiring board, the oxidized portions and resin of the wiring board are attached through oxygen binding, and the adhesion strength between the first external electrode 13 and the resin wiring board is thus increased. It is to be noted that the effect mentioned above is greater when the entire surface of the first external electrode 13 is oxidized.

The first Cu plated layer 13b is preferably about 1 μm to about 10 μm in thickness.

The second external electrode 14 includes a second base layer 14a and a second Cu plated layer 14b. The second base layer 14a is provided over the ceramic body 10. The second base layer 14a can be formed by firing a conductive paste layer formed by applying a conductive paste, for example.

The second base layer 14a includes a metal and glass. Examples of the metal included in the second base layer 14a include, for example, appropriate metals such as Ni, Cu, Ag, Pd, Au, and Ag—Pd alloys.

The second base layer 14a is preferably about 1 μm to about 20 μm in thickness.

The second Cu plated layer 14b is provided over the second base layer 14a. The surface of the second Cu plated layer 14b may be at least partially oxidized. For example, the second Cu plated layer 14b preferably has ridges oxidized. In this case, when the capacitor is embedded into a wiring board, the oxidized portions and resin of the wiring board are attached through oxygen binding, and the adhesion strength between the second external electrode 14 and the resin wiring board is thus able to be increased. It is to be noted that the effect mentioned above is greater when the entire surface of the second external electrode 14 is oxidized.

The second Cu plated layer 14b is preferably about 1 μm to about 10 μm in thickness.

It is to be noted that the second Cu plated layer 14b may include multiple layers instead of just one layer.

As just described, when the outermost layer of the second external electrode 14 includes a Cu plated film, it becomes possible to use the multilayer ceramic capacitor 1 as an electronic component built in a multilayer printed wiring board.

In addition, in the case of embedding the multilayer ceramic capacitor 1 into a multilayer printed wiring board, there is a need to provide a via hole for electronic component connection in the multilayer printed wiring board, in order to provide electrical connection to the second external electrode 14. This via hole for electronic component connection is formed with the use of a laser such as a $CO_2$ laser, for example. In the case of forming the via hole with the use of a laser, the second external electrode 14 of the multilayer ceramic capacitor 1 is directly irradiated with the laser. In this case, when the second plated layer 14b of the second external electrode 14 includes a Cu plated layer, the laser can be reflected at a high reflectance, and the capacitor is thus able to be used in a preferred manner as the multilayer ceramic capacitor 1 to be embedded into a multilayer printed wiring board. When the laser reflectance is low with respect to the second external electrode of the multilayer ceramic capacitor 1, the laser may reach even the inside of the multilayer ceramic capacitor 1, and damage the multilayer ceramic capacitor 1.

As described above, the first and second base layers 13a, 14a can be formed by, for example, a dip method. Specifically, the layers can be formed in such a way that ends of the ceramic body 10 are immersed in a conductive paste, dried, and then baked. When the first and second base layers 13a, 14a are prepared by such a preparation method, the first and second external electrodes 13, 14 are typically not uniform in thickness. For example, the thicknesses of portions located over the first principal surface 10a for each of the first and second external electrodes 13, 14 are gradually increased once, and gradually decreased outward from the center of the ceramic body 10 in the length direction L.

The metal in the internal electrodes 11, 12 is preferably diffused in the external electrodes 13, 14. The diffusion of the metal in the internal electrodes 11, 12 to the external electrodes 13, 14 expands the volume of the metal in the external electrodes 13, 14 to fill minute gaps in the external electrodes 13, 14, thus improving the sealing property against ingress of moisture. It is to be noted that the diffusion distance of the metal in the internal electrodes 11, 12 to the external electrodes 13, 14 is preferably about 4 μm or more.

It is to be noted that the first and second external electrodes 13, 14 may be each at least partially embedded in the first and second principal surfaces 10a, 10b.

The terminal sides of portions of the first and second external electrodes 13, 14 located over the first and second principal surfaces 10a, 10b may be linear, convex, or concave, but preferably more linear. The linear shape herein refers to, when the line connecting both ends at end edges of the first external electrode 13 and second external electrode 14 located on the principal surfaces 10a, 10b is regarded as a reference line P in planar view, a shape where the width h with respect to the reference line P is not more than about ±30 μm away from the positions of the centers in the width direction (the positions at about ½ dimension in the width direction) of the end edges of the first external electrode 13 and second external electrode 14. When the portions of the first and second external electrodes 13, 14 located over the first and second principal surfaces 10a, 10b have linear end sides, the first external electrode 13 and the second external electrode 14 can be formed uniformly even at both ends of the ceramic body 10 in the width direction. As a result, even when the laser for irradiation is somewhat shifted in embedding the multilayer ceramic capacitor 1 into a multilayer printed wiring board, it is possible to irradiate the surfaces of the first external electrode 13 and second external electrode 14 with the laser, and the probability of joint is increased between the via hole and the multilayer ceramic capacitor 1.

A method for manufacturing the multilayer ceramic capacitor 1 is not particularly limited. The multilayer ceramic capacitor 1 can be manufactured, for example, in the following manner.

First, ceramic green sheets are prepared to define the ceramic body 10. Next, conductive paste layers are formed by applying a conductive paste onto the ceramic green sheets. The conductive paste can be applied by various printing methods such as a screen printing method, for example. The conductive paste may contain a binder and a solvent besides conductive particulates.

Next, a plurality of ceramic green sheets without any conductive paste layer formed, the ceramic green sheets with conductive paste layers formed to correspond to the first or second internal electrodes, and a plurality of ceramic green sheets without any conductive paste layer provided thereon are stacked in this order, and pressed in the stacking direction to prepare a mother laminate body.

Next, the mother laminate body is cut along a virtual cut line on the mother laminate body to prepare a plurality of raw ceramic laminate bodies from the mother laminate body. It is to be noted that the mother laminate body can be cut with a dicing machine or a pushing machine. The raw ceramic laminate bodies may be subjected to barrel polishing or the like to have ridges or corners rounded.

Next, the raw ceramic laminate bodies are subjected to firing. In this firing step, the first and second internal electrodes are fired. The firing temperature can be set appropriately depending on the types of the ceramic material and conductive paste used. The firing temperature can be adjusted to, for example, on the order of about 900° C. to about 1300° C.

Next, a conductive paste is applied by a method such as dipping to both ends of the fired ceramic laminate bodies (ceramic bodies). Next, the conductive paste applied to the ceramic laminate body is subjected to hot-air drying for about 10 minutes at about 60° C. to about 180° C., for example. Thereafter, the dried conductive paste is baked to form base layers. The baking temperature is preferably adjusted to, for example, about 780° C. to about 900° C.

It is to be noted that with the conductive paste layers formed in advance on the raw ceramic body, the base layers may be subjected to co-firing with the ceramic body and the internal electrodes.

Thereafter, the multilayer ceramic capacitor 1 can be completed by forming one or more plated layers on the base layers.

Now, in firing the raw ceramic body with the conductive paste layers formed to define the first and second base layers 13a, 14a, the conductive paste layers contract more than the raw ceramic body. For this reason, tensile stress is applied to ridges of the ceramic body 10 by contraction of portions of the conductive paste layers located on the principal surfaces, and contraction of portions of the conductive paste layers located on the end surfaces. This tensile stress makes cracks likely to be generated from the ridges of the ceramic body 10.

As shown in FIG. 2, "a" is a distance in the height direction between an effective portion E that refers to a region where the first internal electrodes 11 and the second internal electrodes 12 are opposed in the height direction T, and the first principal surface 10a; "b" is a distance in the length direction between the first end surface 10e and the effective portion E in the length direction L; "c" is a maximum thickness of a portion of the first base layer 13a provided over the first principal surface 10a; "d" is a distance in the length direction L between the thickest portion of the first base layer 13a provided over the first end surface 10e and a portion of the first base layer 13a closest to the second end surface 10f, which is located over the first principal surface 10a; "e" is a maximum thickness of a portion of the first base layer 13a provided over the first end surface 10e; and "f" is a height of the ceramic body 10.

In the multilayer ceramic capacitor 1, the ratio $(c \cdot d + e \cdot f/2)/(a \cdot b)$ is preferably 6 or less. For this reason, with the large $(a \cdot b)$, the ridges of the ceramic body 10 undergo an increase in strength. In addition, the tensile stress applied to the ridges of the ceramic body 10 is reduced because the first base layer 13a is thin with the small $(c \cdot d + e \cdot f/2)$. Therefore, the multilayer ceramic capacitor 1 is unlikely to be cracked from the ridges of the ceramic body 10.

Furthermore, the ratio $(c \cdot d + e \cdot f/2)/(a \cdot b)$ is preferably or more. For this reason, the first base layer 13a is not excessively thin. Accordingly, the multilayer ceramic capacitor 1 has excellent resistance to moisture.

It is to be noted that the thicknesses of the base layers 13a, 14a can be measured by observing, with a microscope, a cross section exposed by polishing the first or second side surface 10c, 10d of the multilayer ceramic capacitor 1 until the height of the multilayer ceramic capacitor 1 is reduced to about ½.

The distance a in the height direction between an effective portion E where the first internal electrodes 11 and the second internal electrodes 12 are opposed in the height direction T and the first principal surface 10a can be measured by observing, with a microscope, a cross section exposed by polishing the first or second side surface 10c, 10d of the multilayer ceramic capacitor 1 until the height of the multilayer ceramic capacitor 1 is reduced to about ½.

In the length direction L, the distance b in the length direction between the first end surface 10e and the effective portion E is referred to as the distance between the internal electrode 12 extending closest to the first end surface 10e among the second internal electrodes 12 and the first end surface 10e in a cross section exposed by polishing the first or second side surface 10c, 10d of the multilayer ceramic capacitor 1 until the height of the multilayer ceramic capacitor 1 is reduced to about ½.

The height f of the ceramic body 10 can be obtained by measuring the height of the center in the width direction W in a cross section obtained by polishing the first or second end surface of the ceramic body 10 until the height of the ceramic body 10 in the length direction L is reduced to about ½.

It is to be noted that the distance a in the height direction between the effective portion E where the first internal electrodes 11 and the second internal electrodes 12 are opposed in the height direction T and the first principal surface 10a can be varied by, in stacking green sheets, increasing or decreasing the number of green sheets stacked without forming any conductive paste layer.

In the length direction L, the distance b in the length direction between the first end surface 10e and the effective portion E can be controlled by varying the size of the electrode figure of a printing plate used to form the conductive paste layers onto the green sheets.

The height f of the ceramic body 10 can be varied arbitrarily depending on the combination of the height of the green sheets with conductive paste layers formed, that is, the effective layers, with the outer layer height.

The thickness c of a portion of the first base layer 13a provided over the first principal surface 10a is able to be adjusted depending on the combination of the viscosity of a paste in which the ceramic body is immersed by a dip process, the thickness of the paste layer, the pull-up rate after the immersion of the ceramic body, etc.

The distance d in the length direction L between the thickest portion of the first base layer 13a provided over the first end surface 10e and a portion of the first base layer 13a closest to the second end surface 10f, which is located over the first principal surface 10a is able to be adjusted depending on the combination of the viscosity of a paste in which the ceramic body is immersed by a dip process, the paste thickness in the paste bath, the period of time for which the ceramic body is immersed in the paste, etc.

The thickness e of a portion of the first base layer 13a provided over the first end surface 10e is able to be adjusted depending on the combination of the viscosity of a paste in which the ceramic body is immersed by a dip process, the thickness of the paste layer, the pull-up rate after the immersion of the ceramic body, etc. In addition, depending on the condition for the pull-up, it is possible to change the magnitude relationship with the thickness of the portion of the first base 13a provided over the first principal surface 10a.

The height f of the ceramic body 10 can be varied arbitrarily depending on the combination of the height of the green sheets with conductive paste layers formed, that is, the effective layers, with the outer layer height.

Now, for example, in a case of forming an external electrode by firing conductive paste layers formed by a dip method or the like, a portion of the external electrode located on the first principal surface may be different in length from a portion thereof located on the second principal surface. In such a case, the position in the length direction of the thickest portion of the external electrode located on the first principal surface is different from the position in the length direction of the thickest portion thereof located on the second principal surface. Mounting this multilayer ceramic capacitor on a mounting substrate with the use of a mounter increases the possibility that the multilayer ceramic capacitor is cracked.

Figure 7:
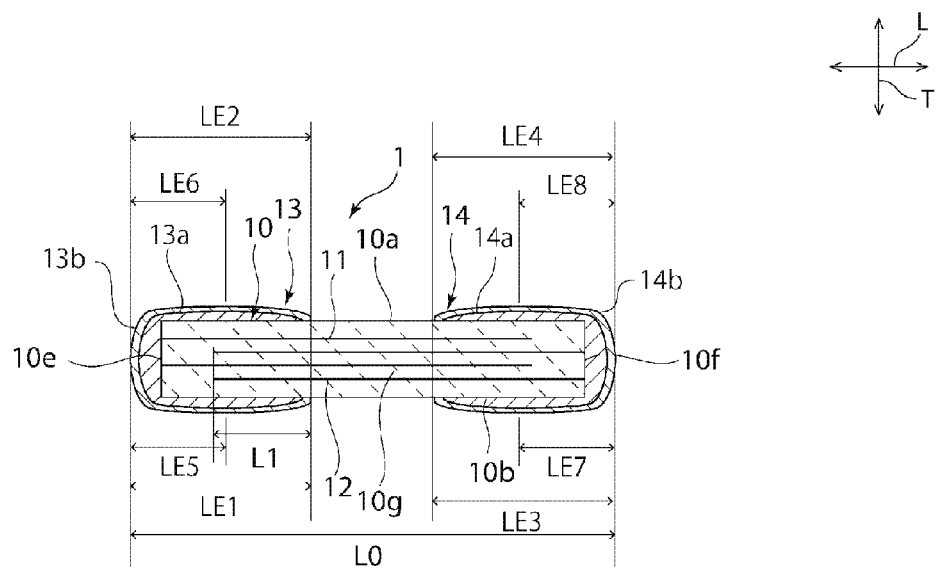
FIG. 7 is a schematic cross-sectional view of a multilayer ceramic capacitor according to a modification example of a preferred embodiment of the present invention.
Figure 8:
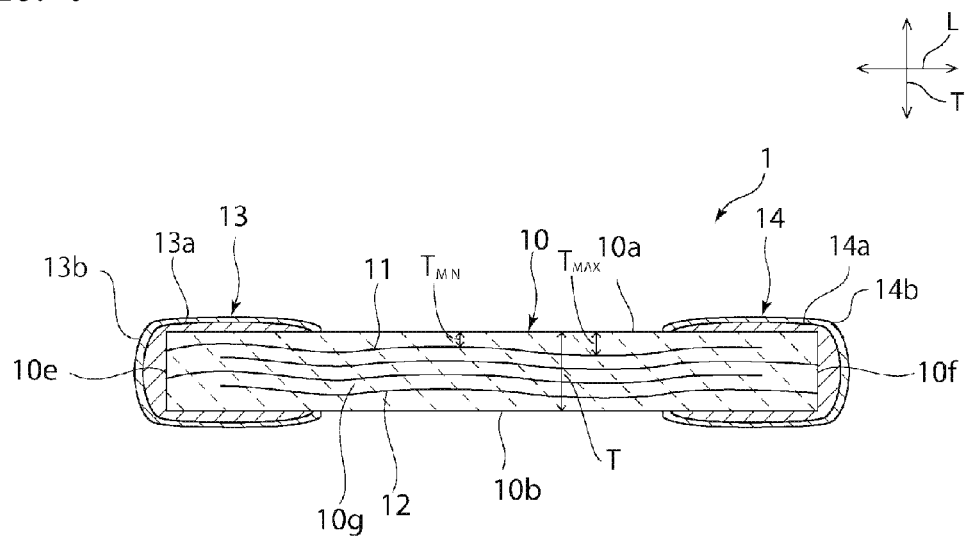
FIG. 8 is a schematic cross-sectional view of a multilayer ceramic capacitor according to a modification example of a preferred embodiment of the present invention.

In this regard, as shown in FIG. 7, the length of the first external electrode 13 in the length direction L is referred to as LE1 as viewed from the second principal surface 10b. The length of the first external electrode 13 in the length direction L is referred to as LE2 as viewed from the first principal surface 10a. The length of the second external electrode 14 in the length direction L is referred to as LE3 as viewed from the second principal surface 10b. The length of the second external electrode 14 in the length direction L is referred to as LE4 as viewed from the first principal surface 10a. The distance in the length direction L is referred to as LE5 between the thickest portion of the first external electrode 13 located on the second principal surface 10b and the outermost end of the first external electrode 13 in the length direction L. The distance in the length direction L is referred to as LE6 between the thickest portion of the first external electrode 13 located on the first principal surface 10a and the outermost end of the first external electrode 13 in the length direction L. The distance in the length direction L is referred to as LE7 between the thickest portion of the second external electrode 14 located on the second principal surface 10b and the outermost end of the second external electrode 14 in the length direction L. The distance in the length direction L is referred to as LE8 between the thickest portion of the second external electrode 14 located on the first principal surface 10a and the outermost end of the second external electrode 14 in the length direction L. The ratio of the absolute value of the difference between LE5 and LE6 to the longer one of LE1 and LE2 ((absolute value of difference between LE5 and LE6)/(longer one of LE1 and LE2)) is referred to as A1. The ratio of the absolute value of the difference between LE7 and LE8 to the longer one of LE3 and LE4 ((absolute value of difference between LE7 and LE8)/(longer one of LE3 and LE4)) is referred to as A2.

In the multilayer ceramic capacitor 1, A1 and A2 are each about 0.2 or less. For this reason, as can be also seen from the results of the following experimental examples, the ceramic body 10 is unlikely to be cracked in mounting the multilayer ceramic capacitor 1 on a mounting substrate with the use of a mounter.

Further, in regard to LE1 and LE3, a cross section is exposed by polishing the first or second side surface 10c, 10d of the multilayer ceramic capacitor 1 until the dimension in the width direction W is reduced down to about ½. The dimensions can be obtained by observing the cross section of the multilayer ceramic capacitor from the second principal surface with the use of an optical microscope, and measuring the length of the external electrode in the center in the width direction W In regard to LE2 and LE4, a cross section is exposed by polishing the first or second side surface 10c, 10d of the multilayer ceramic capacitor 1 until the dimension in the width direction W is reduced down to about ½. The dimensions can be obtained by observing the cross section of the multilayer ceramic capacitor from the first principal surface with the use of an optical microscope, and measuring the length of the external electrode in the center in the width direction W.

In regard to LE5 to LE8, a cross section is exposed by polishing the side surface of the multilayer ceramic capacitor until the dimension in the width direction W is reduced down to about ½. This cross section is observed with the use of an optical microscope to specify the thickest portion of the external electrode located on the principal surface. Next, the dimensions can be obtained by measuring the distance between the thickest portion and the outermost end of the external electrode.

The length in the length direction of the portion of the external electrode located on the principal surface can be controlled by the following method. The length in the length direction of the portion of the external electrode located on the principal surface can be controlled by, for example, varying the wettability to the conductive paste on the ceramic body. The wettability to the conductive paste on the ceramic body can be varied by, for example, applying a surfactant, or carrying out plasma treatment or the like.

In this regard, any of the following conditions (1) to (5) is preferably satisfied in the multilayer ceramic capacitor 1.

Condition 1

The internal electrode located closest to the first principal surface is preferably configured so that the multilayer ceramic capacitor 1 is about 0.9 mm or more and about 1.1 mm or less in length dimension, the multilayer ceramic capacitor 1 is about 0.4 mm or more and about 0.6 mm or less in width dimension, the multilayer ceramic capacitor 1 is about 0.085 mm or more and about 0.11 mm or less in height dimension, and the ratio $(T_{MAX}-T_{MIN})/T$ of about 1.0% to about 5.0% is met. The target dimensions of the multilayer ceramic capacitor 1 preferably are about 1.0 mm in length dimension, about 0.5 mm in width dimension, and about 0.10 mm in height dimension.

Condition 2

The internal electrode located closest to the first principal surface is preferably configured so that the multilayer ceramic capacitor is about 0.9 mm or more and about 1.1 mm or less in length dimension, the multilayer ceramic capacitor is about 0.4 mm or more and about 0.6 mm or less in width dimension, the multilayer ceramic capacitor is about 0.12 mm or more and about 0.15 mm or less in height dimension, and the ratio $(T_{MAX}-T_{MIN})/T$ of about 1.3% to about 5.3% is met. The target dimensions of the multilayer ceramic capacitor 1 preferably are about 1.0 mm in length dimension, about 0.5 mm in width dimension, and about 0.15 mm in height dimension.

Condition 3

The internal electrode located closest to the first principal surface is preferably configured so that the multilayer ceramic capacitor is about 0.9 mm or more and about 1.1 mm or less in length dimension, the multilayer ceramic capacitor is about 0.4 mm or more and about 0.6 mm or less in width dimension, the multilayer ceramic capacitor is about 0.18 mm or more and about 0.20 mm or less in height dimension, and the ratio $(T_{MAX}-T_{MIN})/T$ of about 1.5% to about 5.0% is met. The target dimensions of the multilayer ceramic capacitor 1 preferably are about 1.0 mm in length dimension, about 0.5 mm in width dimension, and about 0.20 mm in height dimension.

Condition 4

The internal electrode located closest to the first principal surface is preferably configured so that the multilayer ceramic capacitor is about 0.9 mm or more and about 1.1 mm or less in length dimension, the multilayer ceramic capacitor is about 0.4 mm or more and about 0.6 mm or less in width dimension, the multilayer ceramic capacitor is about 0.21 mm or more and about 0.23 mm or less in height dimension, and the ratio $(T_{MAX}-T_{MIN})/T$ of about 1.8% to about 5.9% is met. The target dimensions of the multilayer ceramic capacitor 1 preferably are about 1.0 mm in length dimension, about 0.5 mm in width dimension, and about 0.22 mm in height dimension.

Condition 5

The internal electrode located closest to the first principal surface is preferably configured so that the multilayer ceramic capacitor is about 0.9 mm or more and about 1.1 mm or less in length dimension, the multilayer ceramic capacitor is about 0.4 mm or more and about 0.6 mm or less in width dimension, the multilayer ceramic capacitor is about 0.24 mm or more and about 0.30 mm or less in height dimension, and the ratio $(T_{MAX}-T_{MIN})/T$ of about 1.2% to about 6.0% is met. The target dimensions of the multilayer ceramic capacitor 1 preferably are about 1.0 mm in length dimension, about 0.5 mm in width dimension, and about 0.25 mm in height dimension.

The multilayer ceramic capacitor 1 preferably meets any of the conditions (1) to (5). For this reason, the ceramic body 10 is reinforced in a preferred manner with the first and second internal electrodes 11, 12, and the stress applied to the ceramic body 10 when the multilayer ceramic capacitor 1 is mounted with the use of a mounter is effectively dispersed. Accordingly, the ceramic body 10 is more unlikely to be cracked in mounting the multilayer ceramic capacitor 1. Because cracks are unlikely to be generated, the generation of short circuit defects in the multilayer ceramic capacitor 1 is effectively suppressed or prevented.

In firing the raw ceramic body with the conductive paste layers that define the first and second base layers 13a, 14a, the conductive paste layers contract more than the raw ceramic body. For this reason, tensile stress is applied to ridges of the ceramic body 10 by contraction of portions of the conductive paste layers located on the principal surfaces, and contraction of portions of the conductive paste layers located on the end surfaces. This tensile stress makes cracks likely to be generated from the ridges of the ceramic body 10.

Figure 9:
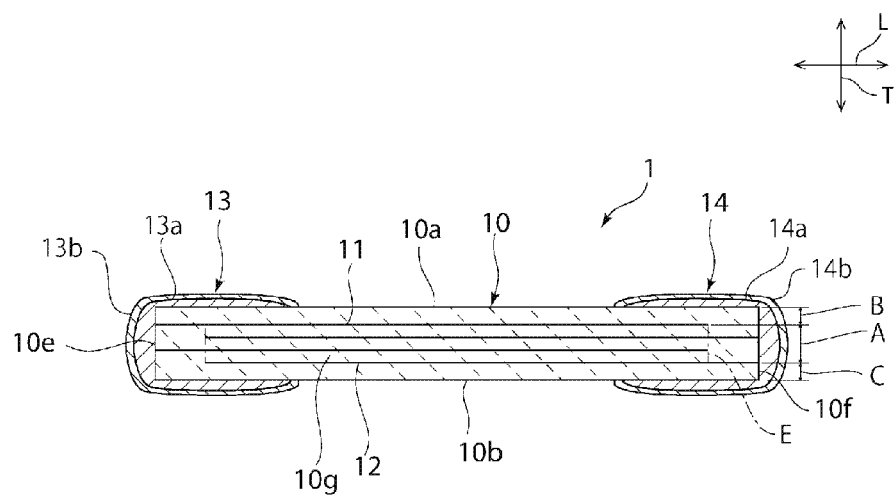
FIG. 9 is a schematic cross-sectional view of a multilayer ceramic capacitor according to a modification example of a preferred embodiment of the present invention.
Figure 10:
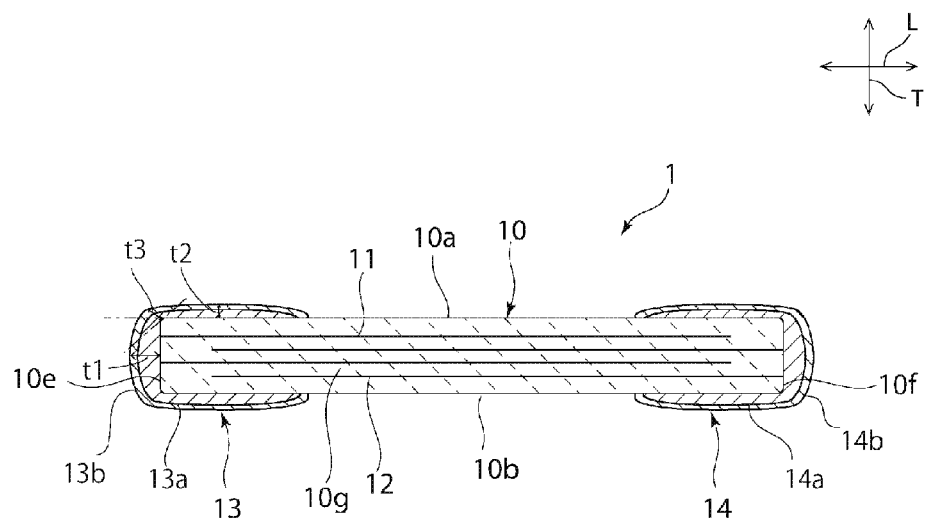
FIG. 10 is a schematic cross-sectional view of a multilayer ceramic capacitor according to a modification example of a preferred embodiment of the present invention.

In this regard, as shown in FIG. 9, the height of an effective portion E that is a portion of the ceramic body 10 where the first and second internal electrodes 11, 12 are provided is referred to as A in the height direction T. The height of a first outer layer portion that is a portion of the ceramic body 10 located closer to the first principal surface 10a than the effective portion E is referred to as B in the height direction T. The height of a second outer layer portion that is a portion of the ceramic body 10 located closer to the second principal surface 10b than the effective portion E is referred to as C in the height direction T.

In the multilayer ceramic capacitor 1, the ratios A/B and A/C each preferably falls within the range of about 0.5 to about 16. For this reason, the crack generation in the ceramic body 10 that starts from the contact point between the first principal surface 10a of the ceramic body 10 and the end of the external electrode is effectively suppressed or prevented. As the reason therefor, the following reason is considered. In the multilayer ceramic capacitor 1, the ratio of the height of the first and second outer layer portions to the height of the effective portion E is decreased when the ratios A/B and A/C are each adjusted in the range of about 0.5 to about 16. More specifically, the first and second outer layer portions become relatively smaller in height. For this reason, when the ceramic body 10 is subjected to firing, compressive stress applied to the first and second outer layer portions is likely to be increased, due to contraction of the conductive paste layers to define the internal electrodes. For this reason, for example, in the case of baking the external electrodes 13, 14 after firing the ceramic body 10, the compressive stress of the first and second outer layer portions is able to be increased before baking the external electrodes 13, 14. For this reason, tensile stress is less likely to be applied to the ceramic body 10, even when the conductive paste layers to define the external electrodes 13, 14 are contracted in baking the external electrodes 13, 14. Therefore, the ceramic body 10 is believed to be less likely to be cracked. Even in the case of simultaneously carrying out firing for the ceramic body 10 and firing to define the external electrodes 13, 14, tensile stress is less likely to be applied to the ceramic body 10 for the same reason, and thus believed to be less likely to be applied to the ceramic body 10.

From the perspective of effectively suppressing or preventing crack generation in the ceramic body 10, when the dimension of the multilayer ceramic capacitor 1 in the height direction T is about 50 μm to about 150 μm, the ratios of A/B and A/C each preferably fall within the range of about 0.6 to about 6. When the dimension of the multilayer ceramic capacitor 1 in the height direction T is about 150 μm to about 250 μm, the ratios of A/B and A/C each preferably fall within the range of about 2 to about 16.

Multilayer ceramic capacitors preferably have external electrodes that are unlikely to be peeled. In the multilayer ceramic capacitor 1, a boundary layer 20 containing about 5 atomic % to about 15 atomic % of Ti, about 5 atomic % to about 15 atomic % of Si, and about 2 atomic % to about 10 atomic % of V (see FIG. 11) is preferably provided between the ceramic body 10 and the base layers 13a, 14a. For this reason, the external electrodes 13, 14 are unlikely to be peeled in the case of the multilayer ceramic capacitor 1.

It is to be noted that as a cause of the fact that the external electrodes are unlikely to be peeled, for example, it is conceivable that when the ceramic body with the base layers formed is immersed in a Cu plating bath in order to form Cu plated layers, glass in the base layers is eluted to decrease the adhesion strength between the base layers and the ceramic body. Therefore, when the boundary layer 20 containing about 5 atomic % to about 15 atomic % of Ti, about 5 atomic % to about 15 atomic % of Si, and about 2 atomic % to about 10 atomic % of V is provided between the ceramic body 10 and the base layers 13a, 14a, the boundary layer 20 which has this composition is formed in such a way that a ceramic component of the ceramic body is reacted with a glass component in the conductive paste layers in firing the ceramic body 10. The boundary layer 20 has excellent resistance to acids and alkalis, and has low solubility in Cu plating baths such as a sulfuric acid Cu bath, a pyrophosphoric acid Cu bath, and a cyan Cu bath. For this reason, the adhesion strength between the base layers 13a, 14a and the ceramic body 10 is unlikely to be decreased in the case of forming the Cu plated layers 13b, 14b. Accordingly, the external electrodes 13, 14 are believed to be unlikely to be peeled on the ceramic body 10.

From the perspective of effective suppression or prevention of peeling of the external electrodes 13, 14, the maximum thickness of the boundary layer 20 is preferably about 0.5 μm to about 5 μm. The external electrodes may be peeled from the ceramic body when the maximum thickness of the boundary layer 20 is smaller than about 0.5 μm, whereas the deflective strength may be decreased because of a decrease in the strength itself of the ceramic body when the maximum thickness of the boundary layer 20 is larger than about 5 μm. The glass included in the ceramic body preferably includes at least one of $B_2O_3$ and $SiO_2$; and at least one selected from the group consisting of $Al_2O_3$, ZnO, CuO, $Li_2O$, $Na_2O$, $K_2O$, MgO, CaO, BaO, $ZrO_2$, SrO, $V_2O_5$, and $TiO_2$.

Figure 11:
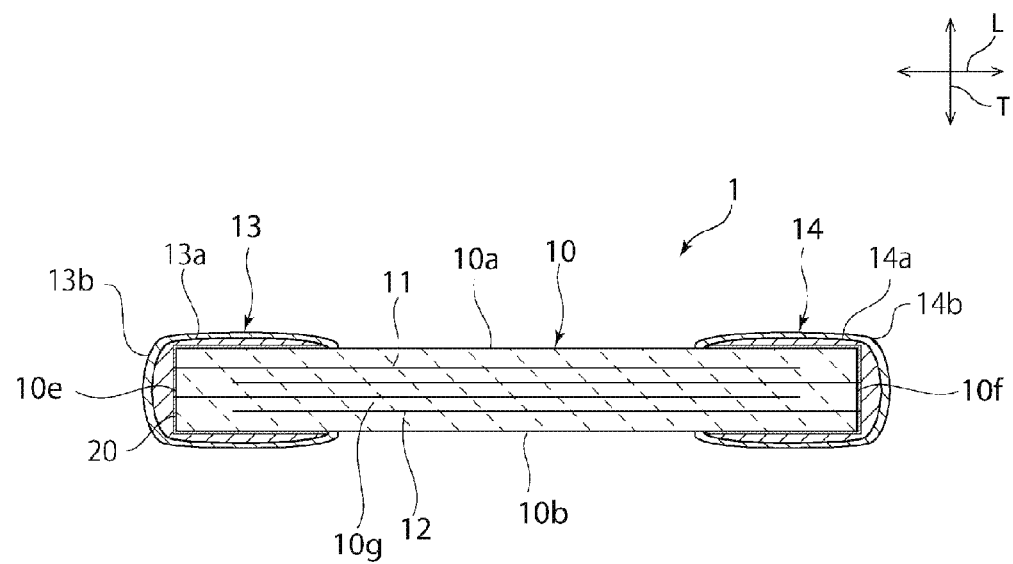
FIG. 11 is a schematic cross-sectional view of a multilayer ceramic capacitor according to a modification example of a preferred embodiment of the present invention.

Further, in the following description, t1 to t3 shown in FIG. 11 will be defined as follows.

The maximum thickness of a portion of the first external electrode 13 located on the first end surface 10e is referred to as t1 in a cross section passing through the center in the width direction W and extending in the length direction L and the height direction T.

The maximum thickness of a portion of the first external electrode 13 located on the first principal surface 10a is referred to as t2 in a cross section passing through the center in the width direction W and extending in the length direction L and the height direction T.

The thickness of the first external electrode 13 on a line passing through the point of intersection between a tangent line on a corner of the ceramic body 10 and the corner and the point of intersection between a line along the first principal surface 10a and a line along the first end surface 10e is referred to as t3 in a cross section passing through the center in the width direction W and extending in the length direction L and the height direction T.

Now, the multilayer ceramic capacitor 1 is embedded into a multilayer printed wiring board, and used. In such a case, the multilayer ceramic capacitor 1 is required to have excellent resistance to moisture, and excellent adhesion to the resin constituting the multilayer printed wiring board.

The inventor has, as a result of earnest study, conceived of the relationships between the shape of the external electrode, and the moisture resistance of the multilayer ceramic capacitor 1 and the adhesion to the resin. Specifically, the inventor has discovered that the relationships among t1 to t3 can control the moisture resistance and the adhesion to the resin.

In the multilayer ceramic capacitor 1, the ratio t2/t1 is preferably about 0.7 to about 1.0, and the ratio t3/t1 is preferably about 0.4 to about 1.2. In this case, a multilayer ceramic capacitor that has excellent resistance to moisture, and excellent adhesion to the resin of the multilayer printed wiring board is achieved.

An excessively small ratio t2/t1 may result in failure to efficiently ensure the thicknesses of the external electrodes 13, 14 around corners of the ceramic body 10, and ingress of plating solutions, etc., into the multilayer ceramic capacitor 1, thus decreasing reliability of resistance to moisture. An excessively large ratio t2/t1 may eliminate the roundness of the external electrodes 13, 14 around corners of the ceramic body 10, and make stress more likely to be concentrated on the corners, thus decreasing the adhesion between the multilayer ceramic capacitor 1 and the resin of the multilayer printed wiring board.

An excessively small ratio t3/t1 may result in failure to efficiently ensure the thicknesses of the external electrodes 13, 14, and ingress of plating solutions, etc., into the multilayer ceramic capacitor 1, thus decreasing the moisture resistance. An excessively large ratio t3/t1 may eliminate the roundness of the external electrodes 13, 14 around corners of the ceramic body 10, and make stress more likely to be concentrated on the corners, thus decreasing the adhesion between the multilayer ceramic capacitor 1 and the resin of the multilayer printed wiring board.

It is to be noted that t1 to t3 can be measured in the following manner.

Method of t1 Measurement

A cross section is exposed by polishing the first or second side surface 10c, 10d of the multilayer ceramic capacitor 1 until the height of the multilayer ceramic capacitor 1 in the width direction W is reduced down to about ½. The maximum thickness t1 of the portion of the first external electrode 13 located on the first end surface 10e can be measured by observing the cross section with the use of a microscope.

Method of t2 Measurement

A cross section is exposed by polishing the first or second side surface 10c, 10d of the multilayer ceramic capacitor 1 until the height of the multilayer ceramic capacitor 1 in the width direction W is reduced down to about ½. The maximum thickness t2 of the portion of the first external electrode 13 located on the first principal surface 10a can be measured by observing the cross section with the use of a microscope.

Method of t3 Measurement

A cross section is exposed by polishing the first or second side surface 10c, 10d of the multilayer ceramic capacitor 1 until the height of the multilayer ceramic capacitor 1 in the width direction W is reduced down to about ½. The thickness t3 of the first external electrode 13 on the line passing through the point of intersection between the tangent line on the corner of the ceramic body 10 and the corner and the point of intersection between the line along the first principal surface 10a and the line along the first end surface 10e can be measured by observing the cross section with the use of a microscope.

It is to be noted that the arithmetic mean roughness (Ra) at the surfaces of the external electrodes 13, 14 is preferably larger than the arithmetic mean roughness (Ra) at the surface of the ceramic body 10 in the present preferred embodiment. More specifically, the ratio of (the arithmetic mean roughness (Ra) at the surface of the ceramic body 10)/(the arithmetic mean roughness (Ra) at the surfaces of the external electrodes 13, 14) preferably falls within the range of about 0.06 or more and about 0.97 or less. In the calculation of the arithmetic mean roughness (Ra) at the surface of the ceramic body 10, as a measurement condition, a laser microscope (Product Name: VK-9510) from Keyence Corporation is preferably used at a 100-fold lens magnification in a color ultradeep mode set. The range of measurement with the laser microscope is regarded as a region of about 90 μm square including a central portion of the principal surface 10a of the ceramic body 10. Then, the arithmetic mean roughness (Ra) at the surface of the ceramic body 10 is regarded as a value calculated on the basis of the surface roughness measured under the measurement condition.

On the other hand, in the calculation of the arithmetic mean roughness (Ra) at the surfaces of the external electrodes 13, 14, as a measurement condition, a laser microscope (Product Name: VK-9510) from Keyence Corporation is preferably used at a 100-fold lens magnification in a color ultradeep mode set. The range of measurement with the laser microscope is regarded as a region of about 90 μm square including a central portion of a portion of the external electrode 13 or external electrode 14 provided on the principal surface 10a or the principal surface 10b. Then, the arithmetic mean roughness (Ra) at the surfaces of the external electrodes 13, 14 is regarded as a value calculated on the basis of the surface roughness measured under the measurement condition.

As described above, the arithmetic mean roughness (Ra) at the surfaces of the external electrodes 13, 14 is preferably larger than the arithmetic mean roughness (Ra) at the surface of the ceramic body. More specifically, the ratio of (the arithmetic mean roughness (Ra) at the surface of the ceramic body 10)/(the arithmetic mean roughness (Ra) at the surfaces of the external electrodes 13, 14) preferably falls within the range of about 0.06 or more and about 0.97 or less. For this reason, in the case of closely contacting the resin of the multilayer printed wiring board with the multilayer ceramic capacitor 1 in embedding the multilayer ceramic capacitor 1 into the multilayer printed wiring board, the close contact between the external electrodes 13, 14 and the resin in an embedding concave portion for the capacitor, which is provided in the multilayer printed wiring board, is made stronger than the close contact between the ceramic body 10 and the resin in an embedding concave portion for the capacitor, which is provided in the multilayer printed wiring board. Therefore, gaps are more unlikely to be produced between the external electrodes 13, 14 and the resin in the embedding concave portion for the capacitor, which is provided in the multilayer printed wiring board. Accordingly, ingress of moisture into the gaps is also suppressed or prevented. As a result, reliability of resistance to moisture is ensured for the multilayer ceramic capacitor 1.

Further, methods to achieve the configuration as described above include, for example, the following method. The ceramic body 10 with desired arithmetic mean roughness (Ra) can be created by providing the surface of a mold for use in pressing with appropriate surface roughness, if necessary, in the step of pressing the mother laminate body. It is to be noted that methods to adjust the arithmetic mean roughness (Ra) at the surface of the ceramic body 10 to desired arithmetic mean roughness (Ra) include a method of applying a physical impact (for example, polishing) to the surface of the ceramic body 10, and a chemical treatment method (for example acid etching).

Figure 4:
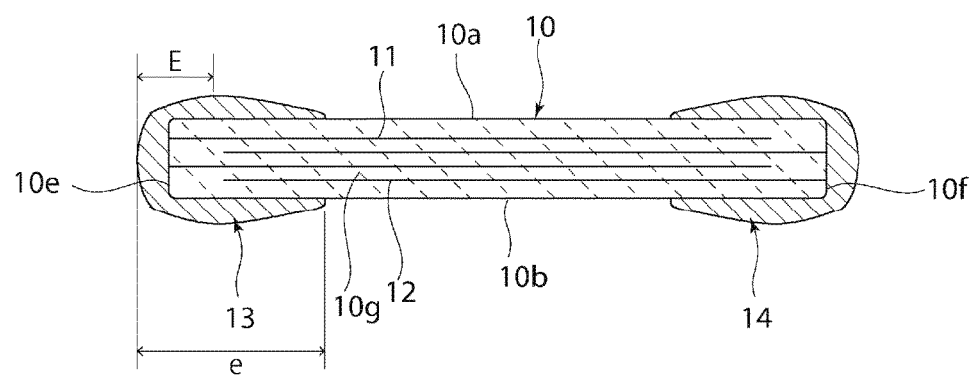
FIG. 4 is a schematic cross-sectional view of a multilayer ceramic capacitor according to a modification example of a preferred embodiment of the present invention.

As shown in FIG. 4, the first external electrode 13 of the multilayer ceramic capacitor 1 is preferably configured so that when the distance from the position of the maximum thickness on the principal surface 10a of the ceramic body 10 to the position of the maximum thickness on the end surface 10e of the ceramic body 10 is referred to as a dimension E (hereinafter, which may be referred to as an "E dimension"), whereas the distance from the position of the maximum thickness on the end surface 10e of the ceramic body 10 to an edge end of the external electrode 13 on the principal surface 10a of the ceramic body 10 is referred to as a dimension e (hereinafter, which may be referred to as an "e dimension"), the ratio E/e is about 0.243 or more and about 0.757 or less.

The dimension E and the dimension e are measured by polishing, for a cross section, the side surface of the multilayer ceramic capacitor 1 in the length direction L until reaching about ½ the dimension in the width direction, and observing the polished surface with an optical microscope. Specifically, the dimensions are measured by the following methods.

(1) Method of E Dimension Measurement

In order to measure the E dimension, the side surface of the multilayer ceramic capacitor 1 is polished in the length direction L until the dimension in the width direction W is reduced down to about ½, and the polished surface is subjected to measurement with an optical microscope. Specifically, in regard to portions located on the principal surface 10a, 10b, of the external electrodes 13, 14 provided on the principal surface 10a or principal surface 10b of the ceramic body 10, the distances are measured from the position of the maximum thickness in the height direction T for each of the portions located on the principal surface 10a, 10b, to the position of the maximum thickness in the length direction L for the external electrode 13, 14 provided on the end surface 10e or end surface 10f of the ceramic body 10. Then, the average for the respective measurement values is regarded as the E dimension.

(2) Method of e Dimension Measurement

In order to measure the e dimension, the side surface of the multilayer ceramic capacitor 1 is polished in the length direction L until the dimension in the width direction W is reduced down to about ½, and the polished surface is subjected to measurement with an optical microscope. Specifically, the distances are measured from the position of the maximum thickness in the length direction L for the external electrode 13, 14 formed on the end surface 10e or end surface 10f of the ceramic body 10, to edge ends of portions located on the principal surface 10a, 10b, of the external electrodes 13, 14 provided on the principal surface 10a or principal surface 10b of the ceramic body 10. Then, the average for the respective measurement values is regarded as the e dimension.

As just described, the formation is preferably achieved so that the ratio E/e is about 0.243 or more and about 0.757 or less. Thus, the stress concentration generated at corners of the multilayer ceramic capacitor 1 is significantly reduced or prevented. As a result, it becomes possible to suppress or prevent peeling that is generated between the corners of the multilayer ceramic capacitor 1 and the resin in the embedding concave portion for the capacitor, which is provided in the multilayer printed wiring board.

Further, methods for making an adjustment so that the ratio E/e is about 0.243 or more and about 0.757 or less include, for example, the following method. The ratio E/e can be adjusted by adjusting the rheology of the conductive paste to define the first and second base layers 13a, 14a, applying surface treatment to the ceramic body 10, or applying the conductive paste more than once.

Figure 5:
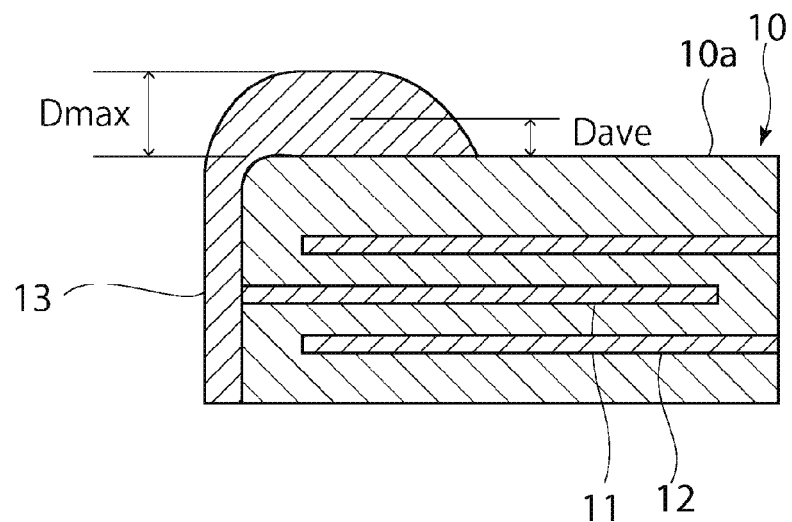
FIG. 5 is a schematic cross-sectional view of a portion of a multilayer ceramic capacitor according to a modification example of a preferred embodiment of the present invention.

As shown in FIG. 5, when the maximum thickness and average thickness of a portion of the first external electrode 13 located on the principal surfaces 10a, 10b of the ceramic body 10 are denoted respectively by $D_{max}$ and $D_{ave}$, the condition expression of $D_{ave} \times 250\% \geq D_{max} \geq D_{ave} \times 120\%$ is preferably satisfied. Likewise, when the maximum thickness and average thickness of a portion of the second external electrode 14 located on the principal surfaces 10a, 10b of the ceramic body 10 are denoted respectively by Dmax and Dave, the condition expression of $D_{ave} \times 250\% \leq D_{max} \leq D_{ave} \times 120\%$ is preferably satisfied.

It is to be noted that the maximum thickness $D_{max}$ and the average thickness $D_{ave}$ are measured by polishing the side surface of the multilayer ceramic capacitor 1 in the length direction L until the dimension in the width direction W is reduced down to about ½, and observing the polished surface with an optical microscope. Specifically, the thicknesses are measured by the following methods.

(1) Method of $D_{max}$ Measurement

In order to measure the maximum thickness $D_{max}$, the side surface of the multilayer ceramic capacitor 1 is polished in the length direction L until the dimension in the width direction W is reduced down to about ½, and the polished surface is subjected to measurement with an optical microscope. Specifically, the thicknesses of the thickest portions in the height direction T for each of portions of the external electrodes 13, 14 located on the principal surface 10a or the principal surface 10b are measured for the measurement of the maximum thickness $D_{max}$. Then, the average for the measurement values is regarded as the maximum thickness $D_{max}$.

(2) Method of $D_{ave}$ Measurement

In order to measure the average thickness $D_{ave}$, the side surface of the multilayer ceramic capacitor 1 is polished in the length direction L until reaching about ½ the dimension in the width direction W, and the polished surface is subjected to measurement with an optical microscope. Specifically, the thicknesses in the height direction T for ten equal portions obtained by dividing, in the length direction L, each of the portions of the external electrodes 13, 14 located on the principal surface 10a or the principal surface 10b are measured for the measurement of the average thickness $D_{ave}$. Then, the average for the measurement values is regarded as $D_{ave}$.

When the condition expression of $D_{ave} \times 250\% \geq D_{max} \geq D_{ave} \times 120\%$ is satisfied, the portions of the external electrodes 13, 14 located on the principal surfaces 10a, 10b are increased in thickness, and the portions of the external electrodes 13, 14 located on the principal surfaces 10a, 10b function as cushioning materials, and disperse the mounting load (stress) applied to the multilayer ceramic capacitor 1 in suctioning the multilayer ceramic capacitor 1 with a suction nozzle of a mounting machine (mounter) or pushing the capacitor into a multilayer printed wiring board. As a result, the generation of breakages and cracks is significantly reduced or prevented without concentrating the mounting load (stress) on portions of the multilayer ceramic capacitor 1 with mechanical strength decreased.

It is to be noted that the maximum thickness $D_{max}$ and the average thickness $D_{ave}$ can be controlled by adjusting the pull-up rate after dipping the ceramic body 10 in the conductive paste. The pull-up rate after dipping the ceramic body 10 in the conductive paste can be adjusted to, for example, about 20 mm/min or more and about 1000 mm/min or less. The viscosity of the conductive paste is preferably about 10 Pa·s or more and about 100 Pa·s or less.

Figure 6:
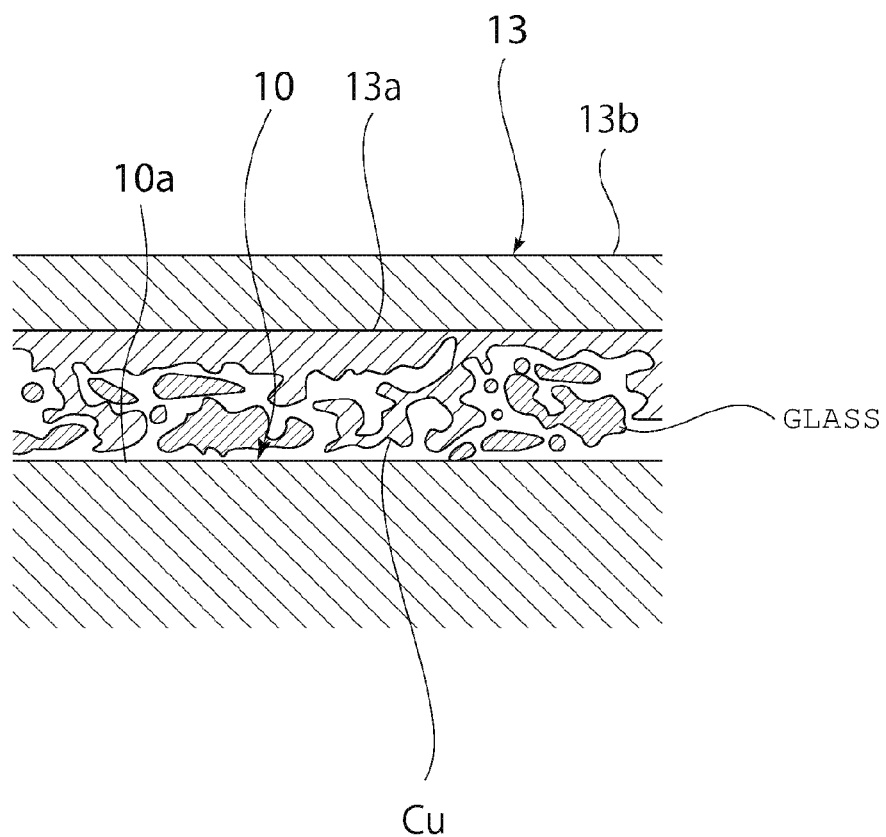
FIG. 6 is a schematic cross-sectional view of a portion of a multilayer ceramic capacitor according to a modification example of a preferred embodiment of the present invention.

As shown in FIG. 6, in the multilayer ceramic capacitor 1, the plated layers 13b, 14b each preferably include a laminate body of two layers of Cu plated films. In this case, ingress of the Cu metal of each Cu plated film constituting the laminate body may be caused into the base layer 13a, 14a, from the surface layer of the base layer 13a, 14a even to the position of about ⅓ or more the thickness of the base layer 13a, 14a. It is to be noted that in regard to the ingress of the metal of the plated film into the base layer 13a, 14a, when the side surface (surface LT) of the multilayer ceramic capacitor 1 is polished in the length direction L to about ½ the dimension in the width direction W, and when a line is drawn along a portion of about ⅓ in height from the surface layer of the base layer 13a, 14a in any observation visual view of about 30 μm in x-axis and about 30 μm in y-axis at the polished surface, including the base layer 13a, 14a provided on the principal surface of the ceramic body, the metal of the plated film is preferably present at about 30% or more with respect to the total proportion of the metal of the base layer 13a, 14a and plated film on the line.

Each Cu plated film is preferably formed with the use of a pyrophosphoric acid Cu plating solution or a cyanide Cu plating solution. These plating solutions with high glass erosion capability, efficiently dissolve the glass contained in the base layer 13a, 14a, thus making ingress of the Cu metal of the Cu plated film likely to be caused into the base layer 13a, 14a. For this reason, the content rate of Cu is likely to be high in the base layers 13a, 14a.

The glass contained in the base layers 13a, 14a preferably contains BaO in an amount of about 10 weight % or more and about 50 weight % or less, SrO in an amount of about 10 weight % or more and about 50 weight % or less, $B_2O_3$ in an amount of about 3 weight % or more and about 30 weight % or less, and $SiO_2$ in an amount of about 3 weight % or more and about 30 weight % or less. In this case, the glass contained in the base layers 13a, 14a is more easily dissolved in pyrophosphoric acid Cu plating solutions and cyanide Cu plating solutions.

It is to be noted that whether the ingress of the Cu metal of the Cu plated film into the base layers 13a, 14a is caused or not can be confirmed by polishing the side surface of the multilayer ceramic capacitor 1 in the length direction L until the dimension in the width direction W is reduced down to about ½, and observing the polished surface with an optical microscope. Specifically, the portion of the external electrode 13 located over the first principal surface 10a is determined as "yes" in the case of ingress of the metal of the Cu plated film into the base layer 13a from the surface layer of the base layer 13a even to the position of about ⅓ or more the thickness of the base layer 13a, or determined as "no" in the case of no ingress from the surface layer of the base layer 13a to the position of about ⅓ or more the thickness of the base layer 13a.

Furthermore, the metal thicknesses of the external electrodes 13, 14 are preferably about 8.7 μm or more and about 13.9 μm or less. The metal thickness refers to a value obtained by measuring the thickness of the metal with a fluorescent X-ray film thickness meter (SFT-9400 from Seiko Instruments Inc.), and converting the measured X-ray Cu amount into a film thickness. In regard to the measurement point, for example, in the center in planar view of the portion of the external electrode 13 located over the first principal surface 10a, the measurement can be made.

The pyrophosphoric acid Cu plating solution and the cyanide Cu plating solution have high glass erosion capability, and efficiently dissolve the glass contained in the base layers 13a, 14a. For this reason, the use of the pyrophosphoric acid Cu plating solution or cyanide Cu plating solution easily causes ingress of the Cu metal of the Cu plated film into the base layer 13a, 14a. Therefore, the content rate of Cu in the base layers 13a, 14a is improved.

In the case of the formation that causes ingress of the Cu metal of the Cu plated film into the base layer 13a, 14a from the surface layer of the base layer 13a, 14a to the position of about ⅓ or more the thickness of the base layer 13a, 14a, the Cu content rate is high in the base layers 13a, 14a. Accordingly, in combination with the base layers 13a, 14a and Cu plated films in total, the content rate of Cu per unit thickness is increased to improve the thermal conductivity (heat release performance) of the base layers 13a, 14a, and increase the laser resistance of the external electrodes 13, 14.

Furthermore, in the case of the formation that causes ingress of the Cu metal of the Cu plated film into the base layer 13a, 14a from the surface layer of the base layer 13a, 14a to the position of about ⅓ or more the thickness of the base layer 13a, 14a, the difference in level between the surface of the multilayer printed wiring board and the surfaces of the external electrodes 13, 14 are reduced because the external electrodes 13, 14 are reduced in thickness. As a result, the gap between the surface of the multilayer printed wiring board and the mounting surface of the ceramic body 10 is narrowed to make peeling less likely to be caused between the multilayer printed wiring board and the external electrodes 13, 14, and also improve the mechanical strength of the component.

Experimental Examples

Two hundred non-limiting examples of multilayer ceramic capacitors (target dimensions: about 1.0 mm in length dimension, about 0.5 mm in width dimension, about 0.15 mm in height dimension) configured in substantially the same fashion as the multilayer ceramic capacitor 1 were prepared for each example with the conditions shown in Table 1 in accordance with the manufacturing method described above. It is to be noted that the respective samples were prepared by varying only c, d, and e, and keeping the other conditions substantially the same.

One hundred samples were mounted on a glass epoxy substrate with the use of a mounting machine to prepare a mounted product. It is to be noted that the amounts of pushing the samples were adjusted to about 1.0 mm. Cross sections of the multilayer ceramic capacitors were exposed by polishing, in the length direction, a cross section in the length direction and height direction of the mounted product prepared until the dimensions in the width direction were reduced to about ½. The cross sections were observed with the use of a microscope to confirm the presence or absence of a crack. The results are shown in Table 1.

Furthermore, the remaining one hundred samples prepared were mounted onto a glass epoxy substrate with the use of a conductive adhesive. Thereafter, a voltage of about 2 V was applied for about 72 hours to the respective samples disposed in a high-temperature and high-humidity tank at about 125° C. and about 95% relative humidity to carry out a humidity resistance acceleration test. Then, the samples with a two-digit decrease in insulation resistance value (IR) were determined as samples with humidity resistance degraded.

TABLE 1

| | Experimental Example | | | | | |
|---|---|---|---|---|---|---|
| | 1 | 2 | 3 | 4 | 5 | 6 |
| a (μm) | 20 | 20 | 20 | 20 | 20 | 20 |
| b (μm) | 75 | 75 | 75 | 75 | 75 | 75 |
| c (μm) | 5 | 10 | 15 | 15 | 20 | 25 |
| d (μm) | 250 | 250 | 300 | 350 | 350 | 400 |
| e (μm) | 5 | 10 | 15 | 15 | 20 | 25 |
| f (μm) | 100 | 100 | 100 | 100 | 100 | 100 |
| (c · d + e · f/2)/(a · b) | 1 | 2 | 3.5 | 4 | 6 | 7.5 |
| The Number of Samples Cracked/Total Number of Samples | 0/100 | 0/100 | 0/100 | 0/100 | 8/100 | |
| The Number of Samples with Humidity Resistance Degraded/Total Number of Samples | 17/100 | 0/100 | 0/100 | 0/100 | 0/100 | 0/100 |

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
    a ceramic body including first and second principal surfaces extending in a length direction and a width direction, first and second side surfaces extending in the length direction and a height direction, and first and second end surfaces extending in the width direction and the height direction;
    a first internal electrode extending in the length direction and the width direction, provided in the ceramic body, and exposed at the first end surface;
    a second internal electrode extending in the length direction and the width direction, provided in the ceramic body, exposed at the second end surface, and the second internal electrode facing the first internal electrode in the height direction with a ceramic portion interposed therebetween;
    a first external electrode connected to the first internal electrode and provided over the first end surface and over the first principal surface;
    a maximum thickness and an average thickness of a portion of the first external electrode located on the first principal surface are denoted respectively by $D_{max}$ and $D_{ave}$; and
    $D_{ave} \times 250\% \geq D_{max} \geq D_{ave} \times 120\%$ is satisfied.
2. The multilayer ceramic capacitor according to claim 1, further comprising:

a second external electrode connected to the second internal electrode and provided over the second end surface and over a portion of each of the first and second principal surfaces; wherein
the first external electrode includes a first base layer provided over a portion of the ceramic body and including a metal and glass, and a first plated layer provided over the first base layer;
the second external electrode includes a second base layer provided over a portion of the ceramic body and including a metal and glass, and a second plated layer provided over the second base layer;
the first and second plated layers each include a Cu plated layer.

3. The multilayer ceramic capacitor according to claim 1, wherein the multilayer ceramic capacitor is about 0.9 mm to about 1.1 mm in length dimension, about 0.4 mm to about 0.6 mm in width dimension, and about 0.085 mm to about 0.15 mm in height dimension.

4. The multilayer ceramic capacitor according to claim 1, wherein
a height of an effective portion that is a portion of the ceramic body where the first and second internal electrodes overlap each other in the height direction is referred to as A in the height direction; and
a height of a first outer layer portion that is a portion of the ceramic body located between the first principal surface and the effective portion is referred to as B in the height direction; and
a height of a second outer layer portion that is a portion of the ceramic body located between the second principal surface and the effective portion is referred to as C in the height direction;
each of ratios A/B and A/C is within a range of about 0.5 to about 16.

5. The multilayer ceramic capacitor according to claim 1, wherein
the multilayer ceramic capacitor is about 0.9 mm or more and about 1.1 mm or less in length dimension, about 0.4 mm or more and about 0.6 mm or less in width dimension, and about 0.085 mm or more and about 0.11 mm or less in height dimension,
a maximum distance from the first principal surface to an internal electrode closest to the first principal surface among the first internal electrode and the second internal electrode in the height direction is referred to as $T_{MAX}$; and
a minimum distance from the first principal surface to the internal electrode closest to the first principal surface in the height direction is referred to as $T_{MIN}$; and
a ratio $(T_{MAX}-T_{MIN})/T$ is about 1.0% to about 5.0%.

6. The multilayer ceramic capacitor according to claim 1, wherein
the multilayer ceramic capacitor is about 0.9 mm or more and about 1.1 mm or less in length dimension, about 0.4 mm or more and about 0.6 mm or less in width dimension, and about 0.12 mm or more and about 0.15 mm or less in height dimension;
a maximum distance from the first principal surface to an internal electrode closest to the first principal surface among the first internal electrode and the second internal electrode in the height direction is referred to as $T_{MAX}$; and
a minimum distance from the first principal surface to the internal electrode closest to the first principal surface in the height direction is referred to as $T_{MIN}$; and
a ratio $(T_{MAX}-T_{MIN})/T$ is about 1.3% to about 5.3%.

7. The multilayer ceramic capacitor according to claim 1, wherein
the multilayer ceramic capacitor is about 0.9 mm or more and about 1.1 mm or less in length dimension, about 0.4 mm or more and about 0.6 mm or less in width dimension, and about 0.18 mm or more and about 0.20 mm or less in height dimension;
a maximum distance from the first principal surface to an internal electrode closest to the first principal surface among the first internal electrode and the second internal electrode in the height direction is referred to as $T_{MAX}$; and
a minimum distance from the first principal surface to the internal electrode closest to the first principal surface in the height direction is referred to as $T_{MIN}$; and
a ratio $(T_{MAX}-T_{MIN})/T$ is about 1.5% to about 5.0%.

8. The multilayer ceramic capacitor according to claim 1, wherein
the multilayer ceramic capacitor is about 0.9 mm or more and about 1.1 mm or less in length dimension, about 0.4 mm or more and about 0.6 mm or less in width dimension, and about 0.21 mm or more and about 0.23 mm or less in height dimension;
a maximum distance from the first principal surface to an internal electrode closest to the first principal surface among the first internal electrode and the second internal electrode in the height direction is referred to as $T_{MAX}$;
a minimum distance from the first principal surface to the internal electrode closest to the first principal surface in the height direction is referred to as $T_{Min}$; and
a ratio $(T_{MAX}-T_{MIN})/T$ is about 1.8% to about 5.9%.

9. The multilayer ceramic capacitor according to claim 1, wherein
the multilayer ceramic capacitor is about 0.9 mm or more and about 1.1 mm or less in length dimension, about 0.4 mm or more and about 0.6 mm or less in width dimension, and about 0.024 mm or more and about 0.30 mm or less in height dimension;
a maximum distance from the first principal surface to an internal electrode closest to the first principal surface among the first internal electrode and the second internal electrode in the height direction is referred to as $T_{MAX}$;
a minimum distance from the first principal surface to the internal electrode closest to the first principal surface in the height direction is referred to as $T_{MIN}$; and
a ratio $(T_{MAX}-T_{MIN})/T$ is about 1.2% to about 6.0%.

10. The multilayer ceramic capacitor according to claim 1, wherein
a distance in the length direction from a position of a surface at a maximum dimension in the height direction of the first external electrode on the first principal surface to a position of a surface at a maximum dimension of the first external electrode in the length direction on the first end surface is referred to as E; and
a distance in the length direction from the position of the surface at the maximum dimension on the first end surface to an edge end of the first external electrode on the first principal surface is referred to as e;
a ratio E/e is about 0.243 or more and about 0.757 or less.

11. The multilayer ceramic capacitor according to claim 1, wherein a height dimension of the ceramic body is DT, a length dimension of the ceramic body is DL, and a width dimension of the ceramic body is DW, and a relationship $(1/7)DW \le DT \le (1/4)DW$ is satisfied.

12. The multilayer ceramic capacitor according to claim 1, wherein a height dimension of the ceramic body is DT and a relationship DT<about 0.15 mm is satisfied.

13. The multilayer ceramic capacitor according to claim 1, wherein the ceramic portion is about 0.5 μm to about 10 μm in height.

14. The multilayer ceramic capacitor according to claim 1, wherein each of the first internal electrode and the second internal electrode is about 0.2 μm to about 2 μm in height.

15. The multilayer ceramic capacitor according to claim 2, wherein each of the first and second base layers is about 1 μm to about 20 μm in thickness.

16. The multilayer ceramic capacitor according to claim 2, wherein the Cu plated layer is about 1 μm to about 10 μm in thickness.

17. The multilayer ceramic capacitor according to claim 2, wherein the Cu plated layer includes a plurality of plated films.

18. An electronic component comprising:
a multilayer printed wiring board; and
the multilayer ceramic capacitor according to claim 1 embedded in the multilayer printed wiring board.

19. The electronic component according to claim 18, wherein a via hole is provided in the multilayer printed wiring board to provide electrical connection to the multilayer ceramic capacitor.

* * * * *